United States Patent [19]

Xiang et al.

[11] Patent Number: 5,363,044
[45] Date of Patent: Nov. 8, 1994

[54] MOTION GHOST MANIPULATION IN MAGNETIC RESONANCE IMAGING

[75] Inventors: Qing-San Xiang, Vancouver; Ross M. Henkelman, Toronto, both of Canada

[73] Assignee: Sunnybrook Health Science Center, Toronto, Canada

[21] Appl. No.: 15,097

[22] Filed: Feb. 9, 1993

[51] Int. Cl.$^5$ ............................................. G01V 3/00
[52] U.S. Cl. .................................. 324/309; 324/307
[58] Field of Search ............... 324/300, 307, 308, 309, 324/314

[56] References Cited

U.S. PATENT DOCUMENTS 5,155,435 10/1992 Kaufman et al. .................... 324/309
5,184,074 2/1993 Kaufman et al. .................... 324/309

OTHER PUBLICATIONS

U.S. patent application Ser. No. 718,678 filed Jun. 21, 1991.

U.S. Ser. No. 08/015,103, filed concurrently with the present application.

Felmlee J. P., Ehman R. L. Spatial presaturation: a method for suppressing low artifacts and improving depiction of vascular anatomy in MR imaging. Radiology 1987; 164:559–564.

Pattany P. M., Philips J. J., Chin I., et al. Motion artifact suppression technique (MAST) for MR imaging. J. Comput assist Tomogr 1987; 11:369–377.

Xiang Q. S., Nalcioglu O. A formalism for generating multiparametric encoding gradients in NMR tomography. IEEE Trans Med Imaging 1987, MI-6(1):14–20.

Stark D. D., Wittenberg J., Edelman R. R., et al. Detection of hepatic metastatases: analysis of pulse sequence performance in MR imaging. Radiology 1986; 159: 365–370.

Runge V. M., Clanton J. A., James A. E. Respiratory gating in magnetic resonance imaging at 0.5 Tesla. Radiology 1984; 151:521–523.

Crooks L. E., Baker B, Chang H., Higgins C. B. Magnetic imaging strategies for heart studies. Radiology 1984; 153:459–465.

Bailes D. R., Gilderdale D. J., Bydder G. M., Collins A. G., Fermin D. N. Respiratory ordering of phase encoding (ROPE): a method for reducing respiratory motion aritfact in MR imaging. J. Comput Assist Tomogr 1985; 9:835–838.

Hinks R. S. Monitored echo gating (MEGA) for the reduction of motion artifacts (abstr). Magn Reson Imaging 1988; 6(Suppl 1):48.

Ehman R. L., Felmlee J. P. Adaptive technique for high–definition MR images of moving structures. Radiology 1989; 173:255–263.

Noll D. C., Pauly J. M., Meyer C. H., Nishimura D. G., Macovski A. Deblurring for non–2D Fourier transform magnetic resonance imaging. Magn Reson Med 1992; 25:319–333.

Pelc N. J., Glover G. H. Improved respiratory compensation (abstr). In: Book of abstracts: Society of Mag-

(List continued on next page.)

Primary Examiner—Louis Arana
Attorney, Agent, or Firm—Edward H. Oldham; Robert R. Schroeder; John H. Pilarski

[57] ABSTRACT

A method for manipulating motion ghosts is disclosed. The method includes acquiring two image data sets, each including a time averaged image component and a ghost component and processing these components to separate the ghosts from the desired image and further using the ghost information to produce a dynamic image. Motion monitoring systems are not required. Improved scan times and noise control are allowed over previous methods.

20 Claims, 4 Drawing Sheets

OTHER PUBLICATIONS netic Resonance in Medicine 1987. Berkeley, Calif: Society of Magnetic Resonance in Medicine, 1987; 776.

Hofman M. B. M., Kouwenhoven M., Sprenger M. Non-triggered MR velocity measurements of pulsatile flow (abstr). In: Book of abstracts: Society of Magnetic Resonance in Medicine 1991. Berkeley, Calif: Society of Magnetic Resonance in Medicine, 1991; 808.

Spraggins T. A. Wireless retrospective gating: Application to cine cardiac imaging. Magn Reson Imaging 1990; 8:675–681.

Kim W. S., Jung K. J., Lee K. D. Ra J. B., Cho Z. H. Extraction of cardiac and respiratory motion cycles by use of projection data in NMR imaging (abstr). In: Book of abstracts: Society of Magnetic Resonance in Medicine 1988. Berkeley, Calif.: Society of Magnetic Resonance in Medicine, 1988; 958.

Ottenberg K. Scanning MR according to a priori image models (abstr). In: Book of abstracts: Society of Magnetic Resonance in Medicine 1991. Berkeley, Calif.: Society of Magnetic Resonance in Medicine, 1991; 202.

Hangiandreou N. J., Wright R. C., Rossman P. J., Riederer S. J. Analysis of MR phase contrast measurements of time-varying velocity waveforms (abstr). In: Book of abstracts: Society of Magnetic Resonance in Medicine 1991. Berkeley, Calif.: Society of Magnetic Resonance in Medicine, 1991; 1156.

MOTION GHOST MANIPULATION IN MAGNETIC RESONANCE IMAGING

FIELD OF THE INVENTION

The invention relates to magnetic resonance imaging methods and systems. In particular, the present invention relates to a method for manipulating motion ghosts.

BACKGROUND OF THE INVENTION

Object motion during the acquisition of MR data produces both blurring and ghosts in the final image. Ghosts appear as equally spaced replicas of the moving object in the phase encoding direction. Collectively these replicas comprise a ghost mask. Ghosts are particularly apparent when the motion is periodic, or nearly so. For most physiological motion, each view of the MR signal is acquired in a period short enough that the object may be considered stationary during the acquisition window. In such case the ghosting is due to the inconsistent appearance of the object from view to view. The primary source of such ghosts is patient motion due to respiration or the cardiac cycle.

Ghosting has been considered problematic due to the potential for diagnostic misinterpretation when the ghosts are superimposed on the anatomical image. Previously, the attempt has been made to eliminate the ghost by methods such as gated MR scanning. Recently, a method for cancellation of image artifacts has been developed as described in U.S. patent application Ser. No. 07/718,678 to Xiang et al, filed Jun. 21, 1991 and incorporated herein by reference. The method employs a decomposition procedure to separate the ghost mask from the desired, unghosted image. The ghost free image obtained is the averaged spin-density distribution during the entire course of the scan. The method of U.S. patent application Ser. No. 07/718,678, requires the acquisition of three MR data sets. Further, a method has been discovered for producing dynamic images from motion ghosts. U.S. Ser. No. 08/015,103 of Xiang et al, filed Feb. 9, 1993 teaches a method for producing dynamic images based on the "three data acquisition" method of U.S. Ser. No. 07/718,678.

A method has now been developed for separation of motion ghosts by acquisition of only two MR data sets and processing. In addition, a dynamic image reconstruction method has now been developed based on the two data acquisition ghost suppression method.

The motion ghost suppression method and the dynamic imaging method disclosed herein avoids the need for monitoring motion and offers a higher data acquisition efficiency than conventional cine magnetic resonance imaging. Improved scan times and noise control are also provided.

SUMMARY OF THE INVENTION

The present invention relates to a method for suppression of ghost artifacts from the unghosted image and for producing a dynamic image of object motion from the image components. In a broad aspect of the present invention there is provided, in an MRI system for producing an image of an object which is subject to motion, a method for removing image artifacts produced by the motion, comprising:

acquiring a first data set comprising a plurality of data pixels, each data pixel containing a time averaged image component $I_o$ and a ghost component $g_1$;

acquiring a second data set comprising a plurality of data pixels, each data pixel containing a time averaged image component $I_o$ and a ghost component $g_2$;

reconstructing the acquired first and second data sets to produce corresponding reconstructed images $I_1$ and $I_2$, respectively, such that the reconstructed images each comprise a plurality of image pixels, each image pixel containing the time averaged image component $I_o$ and the ghost components $g_1$ or $g_2$;

calculating the time averaged image component $I_o$ for each of the plurality of image pixels within a selected region of the reconstructed images;

producing an image of the selected region without ghost artifacts.

In a further aspect of the present invention there is provided, in an NMR system for producing an image of an object which is subject to motion, a method for producing a dynamic image of the object comprising:

acquiring a first data set comprising a plurality of data pixels, each data pixel containing a time averaged image component $I_o$ and a ghost component $g_1$;

acquiring a second data set comprising a plurality of data pixels, each data pixel containing a time averaged image component $I_o$ and a ghost component $g_2$;

reconstructing the acquired first and second data sets to produce corresponding reconstructed images $I_1$ and $I_2$, respectively, such that the reconstructed images each comprise a plurality of image pixels, each image pixel containing the time averaged image component $I_o$ and the ghost components $g_1$ or $g_2$;

calculating the time averaged image component $I_o$ and the ghost components $g_1$ and $g_2$ for each of the plurality of image pixels of the reconstructed images;

processing the time averaged image component $I_o$ and a selected one of the ghost components $g_1$ or $g_2$ to generate a dynamic image; and, mapping the dynamic image of the object.

BRIEF DESCRIPTION OF THE DRAWINGS

For a better understanding of the various aspects of the present invention, reference may be made by way of example to the following diagrammatic drawings in which.

DESCRIPTION OF THE PREFERRED EMBODIMENT

Periodic or quasi-periodic motion during imaging results in the degradation of the acquired MR image by the presence of image artifacts or ghosts along the phase encoded direction. The ghosts can be separated from the desired image. Further, the separated image components which contain information about the motion, can be used to produce dynamic images of the motion. The dynamic images can then be displayed together in a cine-loop to produce a movie of the motion.

A two-dimensional Fourier transformed image having motion ghosts contains two components at each pixel. The first component comprises a time averaged image component $I_o$ representing the time-averaged spin density distribution. The second component comprises the ghost g or image artifacts representing the harmonics of various orders contained in the temporal fluctuation. These ghosts g will be equally spaced along the phase encoding direction spreading out away from the image $I_o$. Since ghosts are simply the Fourier components at various frequencies contained in the time-varying spin density distribution it follows that a dynamic image can be reconstructed by summing all of the available harmonics weighted by appropriate Fourier temporal phase factors. A dynamic image represents the unblurred anatomical configuration at different times.

The method for practicing the present invention employs a conventional pulse sequence to acquire a plurality of MR data sets. Each data set includes 256 views, or phase encodings, and as is commonly done the data sets are acquired in an interleaved manner as will be described in more detail below. Each of the plurality of separate MR data sets are reconstructed by performing a two-dimensional Fourier transformation on each.

Figure 1:
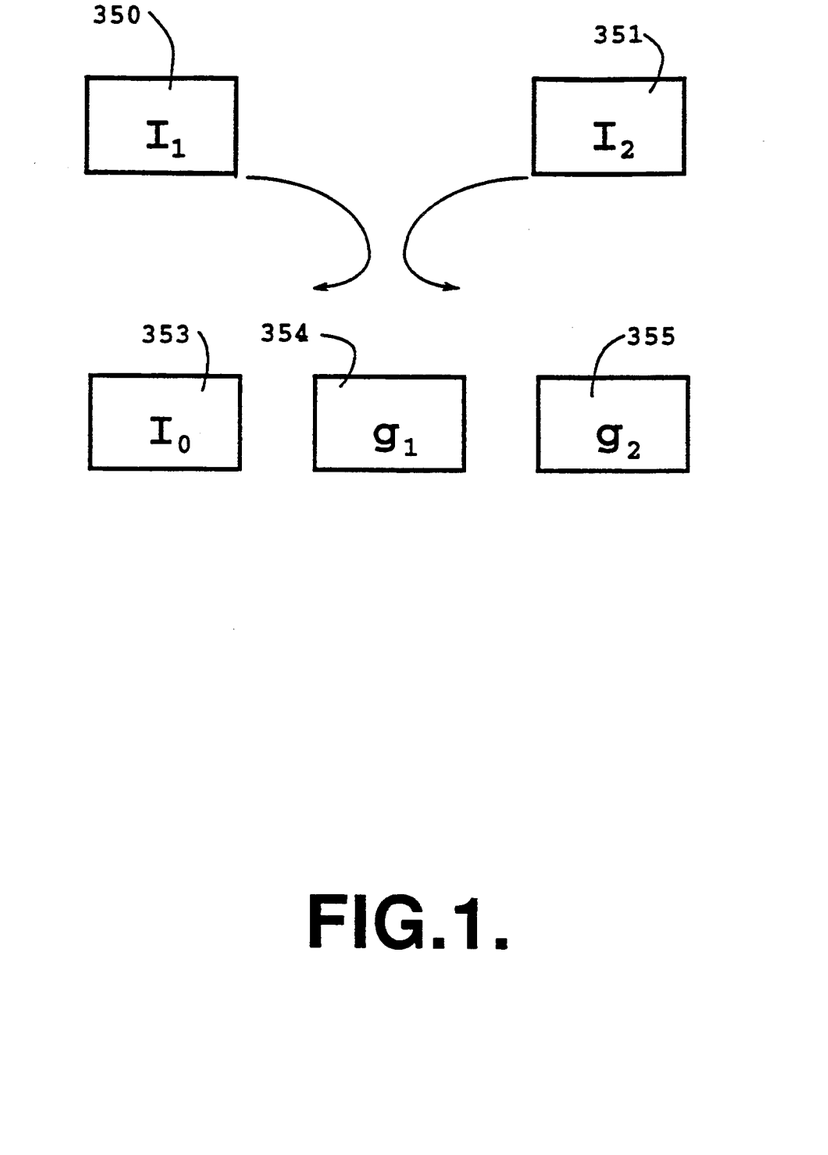
FIG. 1 is a block diagram of the data structures produced when practicing the ghost separation method of the present invention.

Referring particularly to FIG. 1, in a preferred aspect of the method of the present invention, two MR data sets are acquired. The acquisition of the two data sets are such that they occur as close as possible in time and the data for each view of the second data set is acquired between the acquisition of a view for the first data set and a next view for the first data set. The data sets are reconstructed by two-dimensional Fourier transformation producing two 256×256 pixel arrays of complex numbers indicated at 350 and 351 encoding the two reconstructed images $I_1$ and $I_2$. Each of these images $I_1$ and $I_2$ contains data which indicates the correct patient condition ($I_o$) as well as data which produces ghosts ($g_1$ or $g_2$). The image at each pixel in arrays 350 and 351 can be expressed as follows:

$$I_1 = I_o + g_1 \text{ or} \tag{1}$$

$$I_2 = I_o + g_2. \tag{2}$$

In the above equation $I_o$, $I_1$ and $I_2$ and $g_1$ and $g_2$ are complex variables at each pixel representing the time averaged image component, the acquired reconstructed ghosted images and the ghost masks, respectively.

When $I_1$ and $I_2$ are acquired with TE, TR or acquisition interleaving and phase encoding shift, the ghosts $g_1$ and $g_2$ have identical magnitude but differing phases as follows:

$$g_2 = g_1 \exp(i\theta_g) \tag{3}$$

where $\theta_g$ is the phase difference between the two corresponding ghost components $g_1$ and $g_2$ at the same location in the two images. If the phase angle $\theta_g$ is known, then $I_o$ can be obtained from equations (1), (2) and (3) as an output weighted sum image $I_w$ expressed as:

$$I_o = I_w = W_1 I_1 + W_2 I_2 \tag{4}$$

with $W_1$ and $W_2$ being complex weighting factors defined as:

$$W_1 = \tfrac{1}{2}[1 - i \cot(\theta_g/2)] \tag{5A}$$

$$W_2 = \tfrac{1}{2}[1 + i \cot(\theta_g/2)]. \tag{5B}$$

The angle $\theta_g$, which depends on the order of the ghost, the acquisition offset, $\Delta k$, and the position in the image, is generally not known. To avoid the use of the unknown value $\theta_g$, an arbitrary angle $\theta$ is introduced into the complex weighting factors and this results in the weighted image being defined as:

$$I_w = I_o + \hat{g} \tag{6}$$

where $$\hat{g}(x,y;\theta,\theta_g) = g_1(x,y)\exp(i\theta_g/2)\frac{\sin[(\theta - \theta_g)/2]}{\sin(\theta/2)}. \tag{7}$$

The output image in equation (6) has two components, the desired image and a remaining ghost component $\hat{g}$, superimposed on $I_o$. Independent of $\theta$ and $\theta_g$, $I_o$ is always present, but $\hat{g}$ can be made equal to zero if $\theta = \theta_g$. Equation (7), shows how adjusting $\theta$ to be equal to $\theta_g$, cancels $\hat{g}$. Ghosts of different orders have different values of $\theta_g$ and no single value of $\theta$ can be used to separate the ghosts from the desired image $I_o$, throughout the entire field of view. Thus choosing $\theta = \theta_g$ can only be done regionally. To allow global suppression, the field of view can be divided into smaller windows where $\theta$ is tuned independently in each to be equal to $\theta_g$.

A robust criterion is necessary for the regional selection of $\theta$ to allow ghost suppression. For any complex image, a quantity termed "gradient energy", E, can be defined as the sum over all the pixels of the total of the squares of the four partial derivatives, as follows:

$$E = \sum_{\text{pixel}} \left[ \left(\frac{\partial R}{\partial x}\right)^2 + \left(\frac{\partial R}{\partial y}\right)^2 + \left(\frac{\partial I}{\partial x}\right)^2 + \left(\frac{\partial I}{\partial y}\right)^2 \right] \tag{8}$$

where R and I are the real and imaginary parts of the complex image, respectively, and the partial derivatives can be simply taken as the difference between an image and the image shifted by one pixel. In general, for any two differential images $I_A$ and $I_B$ and their summation $I_{AB}$, the following relationship is true within the range of statistical fluctuations $$E_A + E_B = E_{AB} \tag{9}$$

where $E_A$ and $E_B$ are the gradient energies defined in equation (8) for the images $I_A$ and $I_B$ respectively, and $E_{AB}$ is the gradient energy for the image $I_{AB}$ which is the sum of the two images $I_A$ and $I_B$. Equation (9) states that when two images are added, their gradient energies also add.

Since the output image $I_w$ from equation (6) has two components, $I_o$ and the remaining ghost $\hat{g}$, it can be considered as the sum of two images. As $\theta$ changes, $I_o$ remains the same while the ghost component $\hat{g}$ can be either zero (when $\theta = \theta_g$) or non-zero (when $\theta \neq \theta_g$). Since, the gradient energy E is a non-negative quantity, it reaches a minimum in image $I_w$ when the ghost component $\hat{g}$ is zero. This is also true for a region of $I_w$. Thus, the minimization of the gradient energy defined in equation (8) offers a robust regional tuning criterion for ghost suppression.

Figure 2:
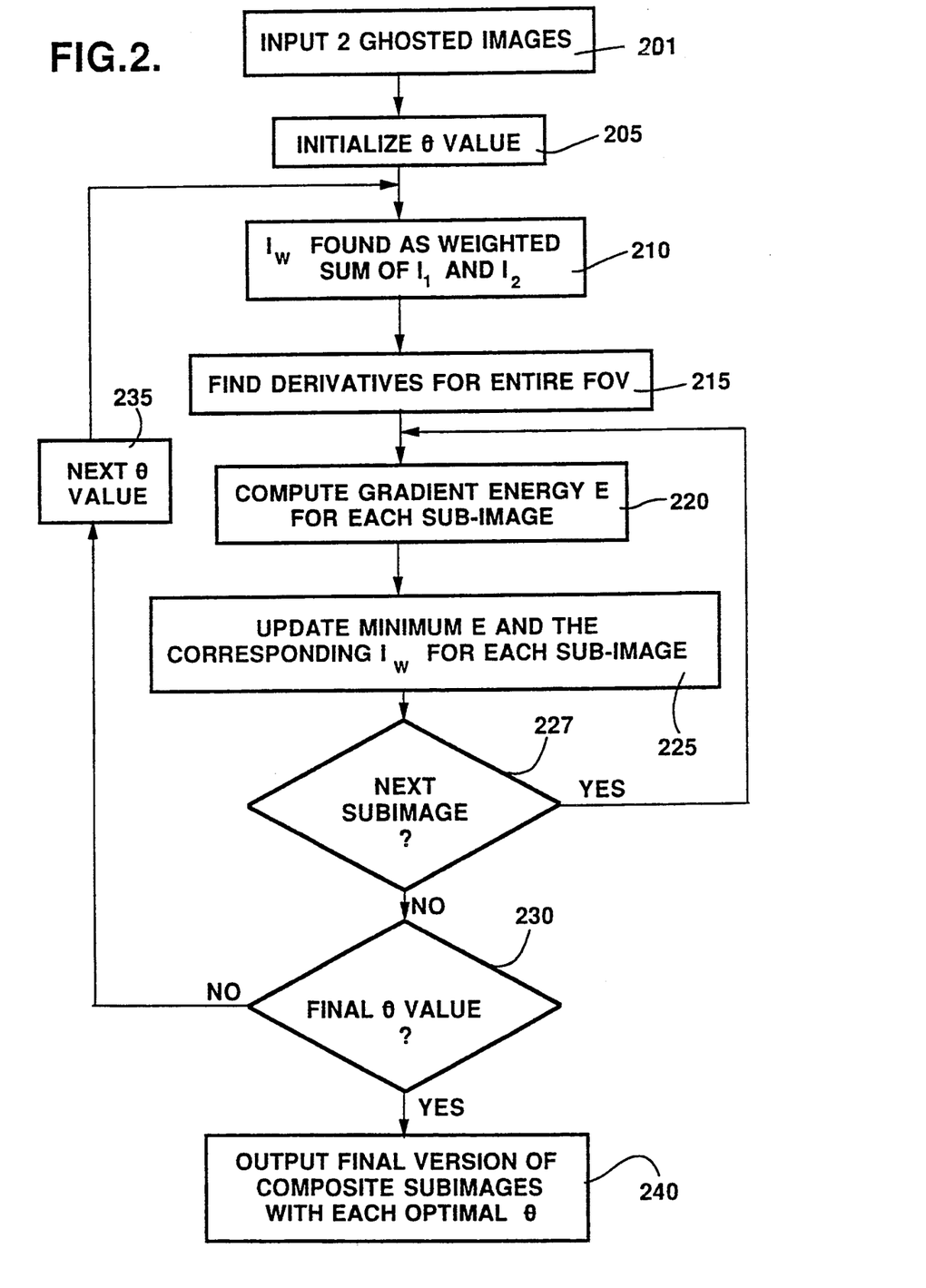
FIG. 2 is a flow chart of a program executed to carry out the ghost separation method of the present invention.

Referring to FIG. 2, a program may be executed for the separation of ghost artifacts according to the present invention. The program is entered at 201 where two sets of data are acquired and reconstructed by 2-dimensional Fourier transformation. The images are added with the complex weighting factors of equations (5A) and (5B) in which $\theta_g$ is replaced with $\theta$ as indicated at process block 205. The image is divided into a number of regions and a number, $N_\theta$, of values of $\theta$ are selected. $I_w$ is computed for each $N_\theta$ as generally indicated at process block 210. The partial derivatives are found for the entire field of view at process block 215. The gradient energy is then evaluated for each region as at process block 220 and the minimum gradient energy and corresponding weighted sum $I_w$ are stored for each region at block 225. Steps 220 and 225 are repeated for each independent subimage as determined at decision block 227. When $N_\theta$ is complete, as determined at decision block 230, the processing is finished. Otherwise, the next $\theta$ value is selected at block 235 and the calculations are stepped through again. The final version of composite subimages, each with its optimal $\theta$, is output at block 240.

In the ghost separation method, a larger $N_\theta$ permits finer tuning but preferably $N_\theta$ is equal to 25 to 50. The size of the region of $I_w$ should be small enough to give truly local tuning, but large enough to provide good statistics and keep equation (9) valid. Preferably, each region is $8^2$ or $16^2$ pixels. The computation time for ghost separation is about four times longer than for standard two-dimensional Fourier transformation.

If the angle $\theta_g$ is very small, the magnitude of the weighting factors will be quite large. This results in an amplification of noise in the output image $I_w$ at the same time the ghost is suppressed. In this case an ideal choice of the arbitrary angle $\theta$ is not simply $\theta_g$ but that which provides a balance between ghost suppression and noise amplification. The $\theta$ determined by minimizing the gradient energy takes the noise of the image into consideration. Both the ghosts and the noise contribute to gradient energy. If ghosts are suppressed at the expense of serious noise amplification, the gradient energy will increase. Thus the minimum of gradient energy chosen by this method reflects a balance between ghost suppression and noise amplification.

Figure 3:
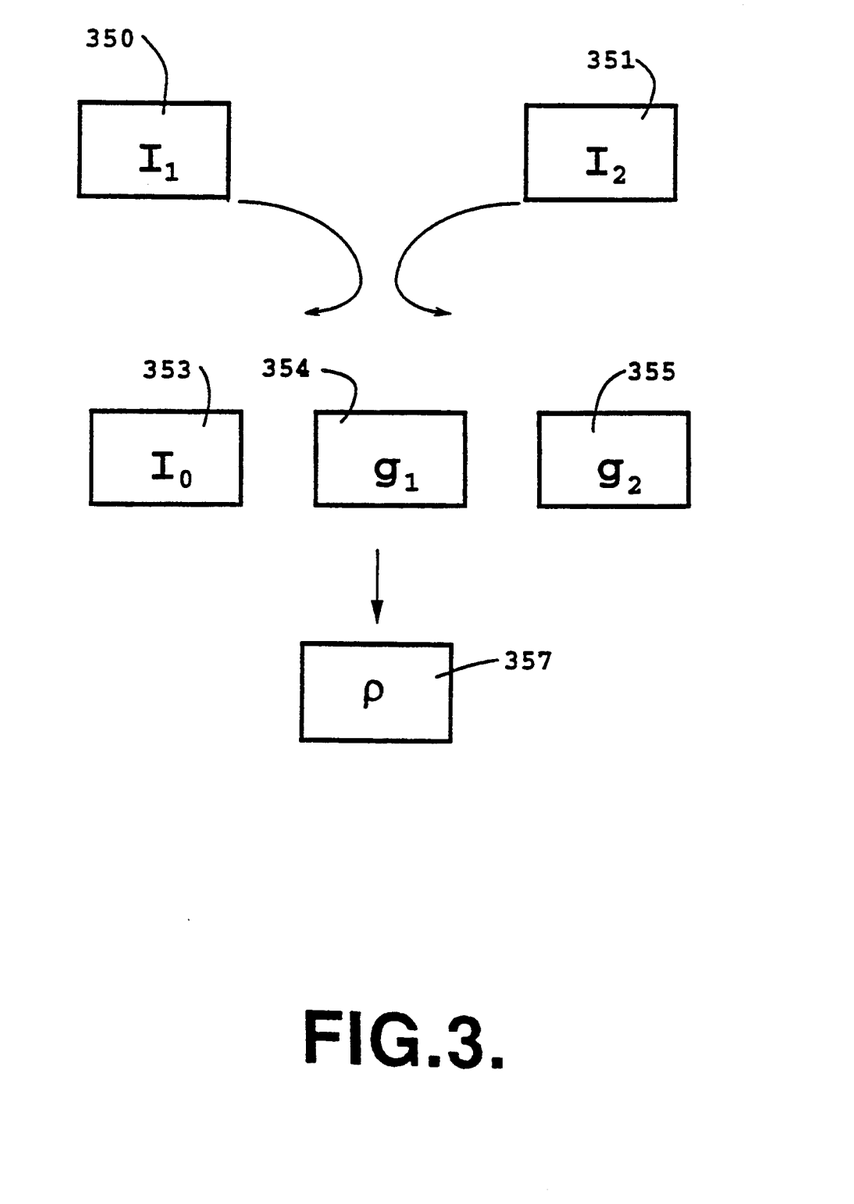
FIG. 3 is a block diagram of the data structures produced when practising the dynamic image method of the present invention.

The ghosts that are separated by the method described hereinbefore can be discarded or, preferably, the information contained in the ghosts can be used to create dynamic images. Referring to FIG. 3, the reconstructed images $I_1$ and $I_2$ indicated at 350 and 351, are processed to obtain the separate unghosted image $I_o$ 353 and the ghost components $g_1$ 354 and $g_2$ 355 as in equations (1) and (2). Dynamic images $\rho$ 357 can be reconstructed based on the unghosted image $I_o$ 353 and the ghost components $g_1$ 354 and $g_2$ 355.

The displacement of a ghost from its source image is directly proportional to the temporal frequency of that specific harmonic. This relationship is expressed as:

$$d_n = n\, P_o \qquad (10)$$

where $d_n$ is the distance measured in pixels between the ghost and its source image, n is the order of the harmonic which is either a positive or negative integer and $P_o$ is the total number of cycles of motion during the entire scan time. Further, $P_o$ is related to the fundamental temporal frequency of the motion $\omega_o$ and the total scan time $T_o$ as expressed by the formula:

$$\omega_o = 2\pi P_o / T_o \qquad (11)$$

After determining $P_o$ and applying equations (10) and (11), the corrected image array $I_o$ and a ghost mask $g_1$ or $g_2$ are then processed together to produce a dynamic image array $\rho(x,y;t)$. Processing of the dynamic image is based on the fact that, for a given pixel in an array in which the spin density is changing with time, the ghost mask records the intensities and phases of various harmonics. Further, the ghosts are located a certain distance $d_n$ away from its source image depending on the temporal frequencies of the ghost. Simply stated and referring to FIG. 3, the dynamic image array $\rho(x,y;t)$ 357 can be produced as a function of time by summing the time averaged image component $I_o$ 353 and a selected ghost component $g_1$ or $g_2$ 354, 355 for each pixel. The dynamic image array is calculated as follows:

$$\rho_j(x,y;t) = I_o(x,y) + \sum_n g_j(x,y + d_n)\exp(i\, n\, \omega_o\, t) \qquad (12)$$

$$(j = 1,2)$$

where $g_j(x,y) = I_j(x,y) - I_o(x,y)$, is the jth ghost mask. The time dependant Fourier phase factors $\exp(in\omega_o t)$ describe the temporal evolution of the harmonics. The summation index n includes various negative and positive integers corresponding to harmonics of different orders on both sides of a pixel (x,y). The dynamic image array 357 is then mapped to produce a dynamic image $I_{DI}$. Two such $\rho_j(x,y;t)$'s may be produced and averaged for signal to noise ratio improvement.

Processing of the dynamic image requires that the ghost components be taken back to their source pixels. Each pixel (x,y) should be studied to be sure it is a source point before applying equation (13). This can be done by satisfying the simple expressions for each pixel as follows:

$$|I_o(x,y)| = \mathrm{Max}\{|I_o(x,y)|,\ |g(x,y+P_o)|,\ |g(x,y-P_o)|\} \qquad (13)$$

$$|g(x,y)| = \mathrm{Min}\{|g(x,y)|,\ |g(x,y+P_o)|,\ |g(x,y-P_o)|\} \qquad (14)$$

If both equations (13) and (14) are satisfied for given pixel (x,y), this pixel is taken as a source point for ghosts and equation (12) is then applied for that pixel.

In an alternative method the dynamic image may be obtained according to the following expression:

$$\rho_j(x,y;t) = I_o(x,y) + \sum_n \frac{\Delta g(x,y + d_n)\exp(i\, n\, \omega_o\, t)}{[1 - \exp(i\, n\, \omega_o\, \Delta t)]} \qquad (15)$$

where $\Delta g$ is the differential image, defined as:

$$\Delta g(x,y) = g_1(x,y) - g_2(x,y) = I_1(x,y) - I_2(x,y) \qquad (16)$$

and $\Delta t$ is the temporal delay between the K-space data modulation due to motion. Source pixels must also be evaluated in this method. To evaluate source pixels, equations (13) and (14) must be satisfied for each pixel while replacing the terms $g(x,y)$ and $g(x,y\pm P_o)$ with $\Delta g(x,y)$ and $\Delta g(x,y\pm P_o)/[1 - \exp(\pm i\, \omega_o\, \Delta t)]$, respectively.

Figure 4:
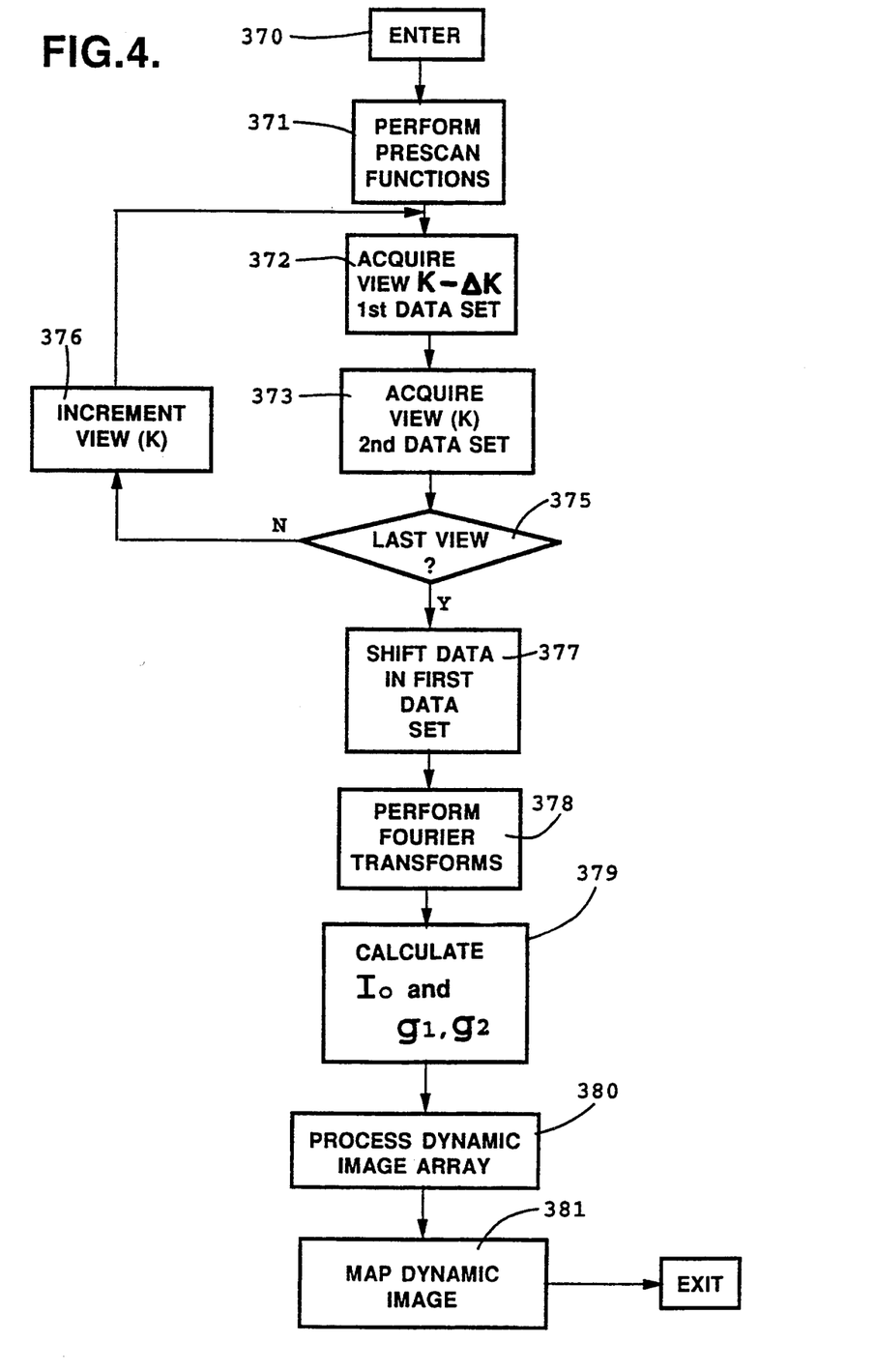
FIG. 4 is a flow chart of a program executed to carry out the dynamic imaging method of the present invention.

Referring to FIG. 4, a program may be executed to perform the dynamic imaging method of the present invention. The program is entered at 370 when executed a number of well known prescan functions, such as system calibrations, are performed as indicated at process block 371. A loop is then entered in which two sets of image data are acquired. The pulse sequence is executed to acquire a view of the first image data set as indicated at process block 372 and the pulse sequence is repeated to acquire a view of the second image data set at process block 373. The phase encoding gradient $G_y$ is different in each of these two pulse sequences such that the view number for the first data set is a predetermined value $\Delta k$ less than the view number for the second data set. $\Delta k$ is typically two to three steps. Wrapped around acquisition should be applied if $k \pm \Delta k$ is out of the normal phase encoding range. When all 256 views have been acquired, as determined at decision block 375, the scan is complete and image reconstruction begin. Otherwise, the view number (k) is incremented by one at block 376 and another series of two pulse sequences is performed.

As indicated at process block 377, the first step in reconstructing an image is to reorder the acquired data in the two image data sets. This is accomplished by shifting the rows of data in the first image data set such that they correspond with the views acquired in each of the 256 rows of the second image data set. Then, as indicated at process block 378, a conventional two-dimensional Fourier transformation is performed on each of the two image data sets to produce the reconstructed images $I_1$ and $I_2$. At process block 379, the value of each complex number in the $I_o$ array 353 is calculated by equation (6) while the value of each complex number in the ghost array g is calculated using equations (1) or (2).

Finally, a dynamic image as a function of time is produced at 380 using equations (12) or (15). The dynamic image is then mapped to a CRT or to storage for later use 381.

The method of the present invention should be used cautiously with imaging of bulky objects. Overlapping of ghosts and wrap around should be avoided by selecting appropriate imaging parameters as are appreciated by those skilled in the art.

The method of the present invention has been discussed in relation to quasi-periodic motion however the present invention is not restricted to imaging of this type of motion. Monotonic motion may be imaged by the method of the present invention provided that the k-space signal modulation appear quasi-periodic. This can be accomplished by ordering the data acquisition in a non-sequential order which causes the data to appear to be quasi-periodically modulated.

In the production of movies from the reconstructed dynamic images any number of images can be produced from a single scan. The images can be generated by using corresponding t values in equations (12) or (15). The images can then be displayed together as a series in a cine-loop for a continuously changing movie.

We claim:

1. In an MRI system for producing an image of an object which is subject to motion, a method for removing image artifacts produced by the motion, comprising:
   acquiring a first data set comprising a plurality of data pixels, each data pixel containing a time averaged image component $I_o$ and a ghost component $g_1$;
   acquiring a second data set comprising a plurality of data pixels, each data pixel containing a time averaged image component $I_o$ and a ghost component $g_2$;
   reconstructing the acquired first and second data sets to produce corresponding reconstructed images $I_1$ and $I_2$, respectively, such that the reconstructed images each comprise a plurality of image pixels, each image pixel containing the time averaged image component $I_o$ and the ghost components $g_1$ or $g_2$;
   calculating the time averaged image component $I_o$ for each of the plurality of image pixels within a selected region of the reconstructed images;
   producing an image of the selected region without ghost artifacts.

2. The method of claim 1 wherein the processing of the time averaged image component $I_o$ is accomplished according to the expression:

$$I_o = I_w = W_1 I_1 + W_2 I_2$$

where $I_w$ is an output weighted sum image and $W_1$ and $W_2$ are complex weighting factors defined as:

$$W_1 = \tfrac{1}{2}[1 - i \cot(\theta/2)]$$

$$W_2 = \tfrac{1}{2}[1 + i \cot(\theta/2)].$$

where $\theta$ is an arbitrary angle, and wherein $\theta$ is selected such that the gradient energy value E for the selected region is at a minimum where E, is defined as a sum over all the pixels of the total of the squares of the four partial derivatives, as follows:

$$E = \sum_{\text{pixel}} \left[ \left(\frac{\partial R}{\partial x}\right)^2 + \left(\frac{\partial R}{\partial y}\right)^2 + \left(\frac{\partial I}{\partial x}\right)^2 + \left(\frac{\partial I}{\partial y}\right)^2 \right]$$

where R and I are the real and imaginary parts of a complex image, respectively, and the partial derivatives are the difference between an image and the image shifted by one pixel.

3. The method of claim 1 wherein the reconstructed images $I_1$ and $I_2$ are produced by two-dimensional Fourier transformation.

4. The method of claim 1 wherein each data set is acquired as a series of views in which a phase encoding gradient is stepped through a sequence of discrete values, and the views for the first and second data sets are interleaved such that each view for the second data set is acquired between the acquisition of a view for the first data set and a next view for the first data set.

5. The method of claim 4 wherein the reconstructed images $I_1$ and $I_2$ are produced by two-dimensional Fourier transformation.

6. The method of claim 5 wherein the processing of the time averaged image component $I_o$ is accomplished according to the expression:

$$I_o = I_w = W_1 I_1 + W_2 I_2$$

where $I_w$ is an output weighted sum image and $W_1$ and $W_2$ are complex weighting factors defined as:

$$W_1 = \tfrac{1}{2}[1 - i \cot(\theta/2)]$$

$$W_2 = \tfrac{1}{2}[1 + i \cot(\theta/2)].$$

where $\theta$ is an arbitrary angle, and wherein $\theta$ is selected such that the gradient energy value E for the selected region is at a minimum where E, is defined as a sum over all the pixels of the total of the squares of the four partial derivatives, as follows:

$$E = \sum_{\text{pixel}} \left[ \left( \frac{\partial R}{\partial x} \right)^2 + \left( \frac{\partial R}{\partial y} \right)^2 + \left( \frac{\partial I}{\partial x} \right)^2 + \left( \frac{\partial I}{\partial y} \right)^2 \right]$$

where R and I are the real and imaginary parts of a complex image, respectively, and the partial derivatives are the difference between an image and the image shifted by one pixel.

7. The method of claim 1 wherein the method is repeated for a plurality of selected regions in a field of view to produce an image of a complete field of view without ghost artifacts.

8. The method of claim 2 wherein the method is repeated for a plurality of selected regions in a field of view to produce an image of a complete field of view without ghost artifacts.

9. The method of claim 6 wherein the method is repeated for a plurality of selected regions in a field of view to produce an image of a complete field of view without ghost artifacts.

10. In an MRI system for producing an image of an object which is subject to motion, a method for producing a dynamic image of the object comprising:
   acquiring a first data set comprising a plurality of data pixels, each data pixel containing a time averaged image component $I_o$ and a ghost component $g_1$;
   acquiring a second data set comprising a plurality of data pixels, each data pixel containing a time averaged image component $I_o$ and a ghost component $g_2$;
   reconstructing the acquired first and second data sets to produce corresponding reconstructed images $I_1$ and $I_2$, respectively, such that the reconstructed images each comprise a plurality of image pixels, each image pixel containing the time averaged image component $I_o$ and the ghost components $g_1$ or $g_2$;
   calculating the time averaged image component $I_o$ and the ghost components $g_1$ and $g_2$ for each of the plurality of image pixels of the reconstructed images;
   processing the time averaged image component $I_o$ and a selected one of the ghost components $g_1$ or $g_2$ to generate a dynamic image; and,
   mapping the dynamic image of the object.

11. The method of claim 10 wherein the processing of the time averaged image component $I_o$ and a selected one of the ghost components $g_1$ or $g_2$ to generate a dynamic image is accomplished according to the expression:

$$\rho_j(x,y;t) = I_o(x,y) + \sum_n g_j(x,y + d_n)\exp(i\, n\, \omega_o\, t)$$

$(j = 1 \text{ or } 2)$ where $\rho_j(x,y;t)$ is a generated dynamic image pixel, $I_o(x,y)$ is the time averaged image component of an image pixel, $g_j(x,y)$ is a selected one of the ghost components $g_1$ or $g_2$ of an image pixel, t is a time with which the spin density changes, $d_n$ is a distance between a ghost and an image source measured in pixels, n is an order of the harmonic and $\omega_o$ is a fundamental temporal frequency of the motion.

12. The method of claim 10 wherein the reconstructed images $I_1$ and $I_2$ are produced by two-dimensional Fourier transformation.

13. The method of claim 10 wherein each data set is acquired as a series of views in which a phase encoding gradient is stepped through a sequence of discrete values, and the views for the first and second data sets are interleaved such that each view for the second data set is acquired between the acquisition of a view for the first data set and a next view for the first data set.

14. The method of claim 13 wherein the reconstructed images $I_1$ and $I_2$ are produced by two-dimensional Fourier transformation.

15. The method of claim 14 wherein the processing of the time averaged image component $I_o$ is accomplished according to the expression:

$$I_o = I_w = W_1 I_1 + W_2 I_2$$

where $I_w$ is an output weighted sum image and $W_1$ and $W_2$ are complex weighting factors defined as:

$$W_1 = \tfrac{1}{2}[1 - i \cot(\theta/2)]$$

$$W_2 = \tfrac{1}{2}[1 + i \cot(\theta/2)].$$

where $\theta$ is an arbitrary angle, and wherein $\theta$ is selected such that the gradient energy value E for the selected region is at a minimum where E, is defined as a sum over all the pixels of the total of the squares of the four partial derivatives, as follows:

$$E = \sum_{\text{pixel}} \left[ \left( \frac{\partial R}{\partial x} \right)^2 + \left( \frac{\partial R}{\partial y} \right)^2 + \left( \frac{\partial I}{\partial x} \right)^2 + \left( \frac{\partial I}{\partial y} \right)^2 \right]$$

where R and I are the real and imaginary parts of a complex image, respectively, and the partial derivatives are the difference between an image and the image shifted by one pixel.

16. The method of claim 15 wherein the ghost components are calculated according to the expressions:

$$I_1 = I_o + g_1,$$

or $$I_2 = I_o + g_2.$$

17. The method of claim 16 wherein the dynamic image is processed according to the expression:

$$\rho_j(x,y;t) = I_o(x,y) + \sum_n g_j(x,y + d_n)\exp(i\, n\, \omega_o\, t)$$

$(j = 1 \text{ or } 2)$ where $\rho_j(x,y;t)$ is a generated dynamic image pixel, $I_o(x,y)$ is the time averaged image component of an image pixel, $g_j(x,y)$ is a selected one of the ghost components $g_1$ or $g_2$ of an image pixel, t is a time with which the spin density changes, $d_n$ is a distance between a ghost and an image source measured in pixels, n is an order of the harmonic and $\omega_o$ is a fundamental temporal frequency of the motion.

18. In an MRI system for producing an image of an object which is subject to motion, a method for producing a dynamic image of the object comprising:

acquiring a first data set comprising a plurality of data pixels, each data pixel containing a time averaged image component $I_o$ and a ghost component $g_1$;

acquiring a second data set comprising a plurality of data pixels, each data pixel containing a time averaged image component $I_o$ and a ghost component $g_2$;

reconstructing the acquired first and second data sets to produce corresponding reconstructed images $I_1$ and $I_2$, respectively, such that the reconstructed images each comprise a plurality of image pixels, each image pixel containing the time averaged image component $I_o$ and the ghost components $g_1$ or $g_2$;

calculating the time averaged image component $I_o$ and a differential image value $\Delta g$ for each of the plurality of image pixels of the reconstructed images, where $\Delta g = g_1 - g_2$;

processing the time averaged image component $I_o$ and the differential image value $\Delta g$ to generate a dynamic image according to the expression:

$$\rho_1(x,y;t) = I_o(x,y) + \sum_n \frac{\Delta g(x,y + d_n)\exp(i\, n\, \omega_o\, t)}{[1 - \exp(i\, n\, \omega_o\, \Delta t)]}$$

where $\rho_1(x,y;t)$ is a generated dynamic image pixel, $I_o(x,y)$ is the time averaged image component of an image pixel, $\Delta t$ is a temporal delay between the K-space data modulation due to motion, t is a time with which the spin density changes, $d_n$ is a distance between a ghost and an image source measured in pixels, n is an order of the harmonic and $\omega_o$ is a fundamental temporal frequency of the motion; and, mapping the dynamic image of the object.

19. In an MRI system for producing an image of an object which is subject to motion, a method for producing a series of images of the moving object comprising:

(a) acquiring a first data set comprising a plurality of data pixels, each data pixel containing a time averaged image component $I_0$ and a ghost component $g_1$;

(b) acquiring a second data set comprising a plurality of data pixels, each data pixel containing a time averaged image component $I_0$ and a ghost component $g_2$;

(c) reconstructing the acquired first and second data sets to produce corresponding reconstructed images $I_1$ and $I_2$, respectively, such that the reconstructed images each comprise a plurality of image pixels, each image pixel containing the time averaged image component $I_0$ and the ghost component $g_1$ or $g_2$;

(d) calculating the time averaged image component $I_0$ for each of the plurality of image pixels; and (e) processing the time averaged image component $I_0$ and the ghost components $g_1$ and $g_2$ to calculate pixel values for a plurality of images which depict the object at a corresponding plurality of different positions in its motion.

20. The method as recited in claim 19 in which each data set is acquired as a plurality of views and the acquisition of views for the first data set is interleaved with the acquisition of views for the second data set.

* * * * *